United States Patent
Liang (10) Patent No.: US 9,742,437 B2
(45) Date of Patent: Aug. 22, 2017

(54) METHOD FOR LOSSLESS DATA COMPRESSION/DECOMPRESSION AND DEVICE THEREOF

(71) Applicant: MediaTek Singapore Pte. Ltd., Singapore (SG)

(72) Inventor: Minxue Liang, Beijing (CN)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/161,100

(22) Filed: May 20, 2016

(65) Prior Publication Data

US 2017/0070238 A1    Mar. 9, 2017

(30) Foreign Application Priority Data

Sep. 8, 2015  (CN) .......................... 2015 1 0568126

(51) Int. Cl.
  *H03M 7/30* (2006.01)
  *H03M 7/40* (2006.01)

(52) U.S. Cl.
  CPC .......... *H03M 7/3084* (2013.01); *H03M 7/30* (2013.01); *H03M 7/3059* (2013.01); *H03M 7/3088* (2013.01); *H03M 7/40* (2013.01)

(58) Field of Classification Search
  CPC .... H03M 7/3084; H03M 7/3088; H03M 7/30; H03M 7/3059
  USPC .............................................. 341/51, 106, 87
  See application file for complete search history.

(56) References Cited

U.S. PATENT DOCUMENTS

| | | | |
|---|---|---|---|
| 8,990,217 B2* | 3/2015 | Jagmohan | H03M 7/3084 367/14 |
| 9,219,496 B1* | 12/2015 | Leung | H03M 7/6005 |
| 9,270,295 B1* | 2/2016 | Liaghati | H03M 7/3051 |
| 9,516,197 B2* | 12/2016 | Hogan | H04N 9/04 |
| 9,524,052 B2* | 12/2016 | Ahmed | G06F 3/0416 |

* cited by examiner

*Primary Examiner* — Brian Young
(74) *Attorney, Agent, or Firm* — McClure, Qualey & Rodack, LLP (57) ABSTRACT

Lossless data compression and depression devices and lossless data compression and decompression methods are provided. The lossless data compression device includes a processor and an entropy coding circuit. The processor is arranged to determine whether a raw data stream matches data items in a dictionary when a compression command for the raw data stream is received and output corresponding codewords according to the determination result. The entropy coding circuit is arranged to perform entropy coding on the corresponding codewords to obtain a compressed data stream.

18 Claims, 6 Drawing Sheets

METHOD FOR LOSSLESS DATA COMPRESSION/DECOMPRESSION AND DEVICE THEREOF

CROSS REFERENCE TO RELATED APPLICATIONS

This application claims priority of China Patent Application No. 201510568126.3, filed on Sep. 8, 2015, the entirety of which is incorporated by reference herein.

BACKGROUND OF THE INVENTION

Field of the Invention

The invention relates to data compression, and, more particularly, to a method for the lossless data compression/decompression and a device thereof.

Description of the Related Art

With the development of the Internet, transmission of a greater amount of data between terminals, such as video data and photo data transmission, has become a common demand from users. In order to facilitate the transmission of a greater amount of data, the data transmitted between terminals will first be compressed to reduce the quantity of transmitted data.

The current data compression and decompression is performed by processors of terminals. However, the processors of the terminals need to handle a variety of tasks of the terminals, and the processing resources are limited. Thus, in cases where a processor uses most of the resources when dealing with other tasks, if it is desired to compress or decompress data, the remaining resources are not sufficient for the processor, so that the speed for compression and decompression becomes slower.

In addition, lossless data compression technology is provided. That is, no information is lost after the raw data is compressed. According to the lossless data compression, after decompression is performed, data which is exactly the same as the raw data is obtained. Since the information of the raw data can be kept complete, the lossless data compression becomes the mainstream of data compression technology.

BRIEF SUMMARY OF THE INVENTION

The invention provides a lossless data compression device and a lossless data decompression device, which are capable of increasing the compression rate and the decompression rate respectively.

An aspect of the invention provides an exemplary embodiment of a lossless data compression device. The lossless data compression device comprises a processor and an entropy coding circuit. The processor is arranged to determine whether a raw data stream matches data items in a dictionary when a compression command for the raw data stream is received and output corresponding codewords according to the determination result. The entropy coding circuit is arranged to perform entropy coding on the corresponding codewords to obtain a compressed data stream.

The lossless data compression device further comprises a first storage medium coupled with the processor, a dictionary looking-up circuit, and a second storage medium coupled with the dictionary looking-up circuit. Both of the first and second storage mediums are arranged to store the dictionary. When the compression command for the raw data stream is received and a data quantity of the raw data stream exceeds a predetermined data quantity, the processor determines whether the raw data stream to be compressed matches the data items in the dictionary stored in the first storage medium and outputs the corresponding codewords according to the determination result. When the compression command for the raw data stream is received and the data quantity of the raw data stream does not exceed a predetermined data quantity, the dictionary looking-up circuit determines whether the raw data stream to be compressed matches the data items in the dictionary stored in the second storage medium and outputs the corresponding codewords according to the determination result to the entropy coding circuit.

The lossless data compression device further comprises a data stream buffer and a codeword buffer. The data stream buffer is arranged to store the raw data stream. The processor comprises a first control module and a comparison circuit. The first control module is arranged to retrieve data of the raw data stream from the data stream buffer when the compression command is received, look up the dictionary to find out at least one data item which matches a front part of the retrieved data, and write the retrieved data into the dictionary. The data items in the dictionary are other data in the raw data stream which was written into the dictionary previously. The comparison module is arranged to, when the first control module has found out the data item, compare the retrieved data and the data item to obtain a data length of a matching part between the retrieved data and the data item. When the data item is found out, the first control module is arranged to output an unmatching part between the retrieved data and the data item, an address of the data item in the raw data stream, and the data length to the codeword buffer to serve as the corresponding codewords, When no data item is found out, the control module outputs the retrieved data to the codeword buffer to serve as the corresponding codewords.

The lossless data compression device further comprises a third storage medium. The third storage medium is arranged to store a probability table. The entropy coding circuit comprises a second control module and a coding module. The second control module is arranged to retrieve each codeword in the codeword buffer, calculate an occurrence probability of the retrieved codeword among all of the corresponding codewords of the raw data stream, and record the occurrence probability of the retrieved codeword in the probability table. The coding module is arranged to perform the entropy coding on the corresponding codewords of the raw data stream and the occurrence probabilities of the corresponding codewords to obtain the compressed data stream.

The dictionary is a Hash table, and the entropy coding is an adaptive binary arithmetic coding.

Another aspect of the invention provides an exemplary embodiment of a lossless data decompression device. The lossless data decompression device comprises an entropy decoding circuit and a processor. The entropy decoding circuit is arranged to, when a decompression command for a compressed data stream is received, perform entropy decoding on the compressed data stream to obtain corresponding codewords. The processor is arranged to look up a dictionary to obtain raw data corresponding to the corresponding codewords output from the entropy decoding circuit and output a raw data stream which is composed of the raw data.

The lossless data decompression device further comprises a first storage medium coupled with the processor, a dictionary looking-up circuit, and a second storage medium coupled with the dictionary looking-up circuit. Both of the first and second storage mediums are arranged to store the dictionary. When a data quantity of the compressed data stream exceeds a predetermined data quantity, the processor looks up the dictionary to find out the raw data corresponding to the corresponding codewords output from the entropy decoding circuit and outputs the raw data stream composed of the raw data. When a data quantity of the compressed data stream does not exceed a predetermined data quantity, the dictionary looking-up circuit looks up the dictionary to find out the raw data corresponding to the corresponding codewords output from the entropy decoding circuit and outputs the raw data stream composed of the raw data.

The lossless data decompression device further comprises a data stream buffer and a codeword buffer. The codeword buffer is arranged to store the corresponding codewords output from the entropy decoding circuit, and each corresponding codeword comprises an address of a data item in the dictionary matching the corresponding codeword, a data length of the data item, and an unmatching part between the raw data corresponding to the corresponding codeword and the data item. The processor retrieves the data item, which is indicated by the address and has the data length, from the dictionary, combines the data item and the unmatching part to obtain the raw data corresponding to the corresponding codeword, and stores the raw data into the data stream buffer.

The lossless data decompression device further comprises a third storage medium. The third storage medium is arranged to store a probability table which is built during a compression process. The entropy decoding circuit comprises a control module and a decoding module. The control module is arranged to refer to the probability table to find out occurrence probabilities of the corresponding codewords corresponding to the compressed data stream. The decoding module is arranged to perform the entropy decoding on the compressed data stream according to the occurrence probabilities of the corresponding codewords of the compressed data stream to obtain the corresponding codewords.

The dictionary is a Hash table, and the entropy decoding is an adaptive binary arithmetic decoding.

Another aspect of the invention provides an exemplary embodiment of a lossless data compression method for a lossless data compression device. The lossless data compression device comprises a processor and an entropy coding circuit. The lossless data compression method comprises the steps of when a compression command for the raw data stream is received, determining whether a raw data stream matches data items in a dictionary and outputting corresponding codewords according to the determination result by the processor; and performing entropy coding on the corresponding codewords to obtain a compressed data stream by the entropy coding circuit.

The lossless data compression device further comprises a first storage medium coupled with the processor, a dictionary looking-up circuit, and a second storage medium coupled with the dictionary looking-up circuit. Both of the first and second storage mediums are arranged to store the dictionary. The step of when the compression command for the raw data stream is received, determining whether the raw data stream matches data items in the dictionary and outputting the corresponding codewords according to the determination result by the processor comprises the steps of when the compression command for the raw data stream is received and a data quantity of the raw data stream exceeds a predetermined data quantity, determining whether the raw data stream to be compressed matches the data items in the dictionary stored in the first storage medium and outputting the corresponding codewords according to the determination result by the processor; and when the compression command for the raw data stream is received and the data quantity of the raw data stream does not exceed the predetermined data quantity, determining whether the raw data stream to be compressed matches the data items in the dictionary stored in the second storage medium and outputs the corresponding codewords according to the determination result to the entropy coding circuit by the dictionary looking-up circuit.

Another aspect of the invention provides an exemplary embodiment of a lossless data decompression method for a lossless data decompression device. The lossless data decompression device comprises an entropy decoding circuit and a processor. The lossless data decompression method comprising the steps of when a decompression command for a compressed data stream is received, performing entropy decoding on the compressed data stream to obtain corresponding codewords by the entropy decoding circuit; and looking up a dictionary to obtain raw data corresponding to the codewords output from the entropy decoding circuit and outputting a raw data stream which is composed of the raw data by the processor arranged.

The lossless data decompression device further comprises a first storage medium coupled with the processor, a dictionary looking-up circuit, and a second storage medium coupled with the dictionary looking-up circuit. Both of the first and second storage mediums are arranged to store the dictionary. The step of looking up the dictionary to obtain the raw data corresponding to the codewords output from the entropy decoding circuit and outputting the raw data stream which is composed of the raw data by the processor comprises steps of when a data quantity of the compressed data stream exceeds a predetermined data quantity, looking up the dictionary to find out the raw data corresponding to the corresponding codewords output from the entropy decoding circuit and outputting the raw data stream composed of the raw data by the processor; and when the data quantity of the compressed data stream does not exceed the predetermined data quantity, looking up the dictionary to find out the raw data corresponding to the corresponding codewords output from the entropy decoding circuit and outputting the raw data stream composed of the raw data by the dictionary looking-up circuit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

For purposes of illustration without limitation, the following description proposes specific details such as specific system architecture, interfaces, techniques or the like, so that thorough understanding of the present application is made. However, those skilled in the art should understand that other embodiments in the absence of these specific details can also be implemented to achieve present application. In other instances, detailed description is omitted for well-known devices, circuits, and methods, in order to prevent the description of the present application from being impeded by unnecessary detailed description.

Figure 1:
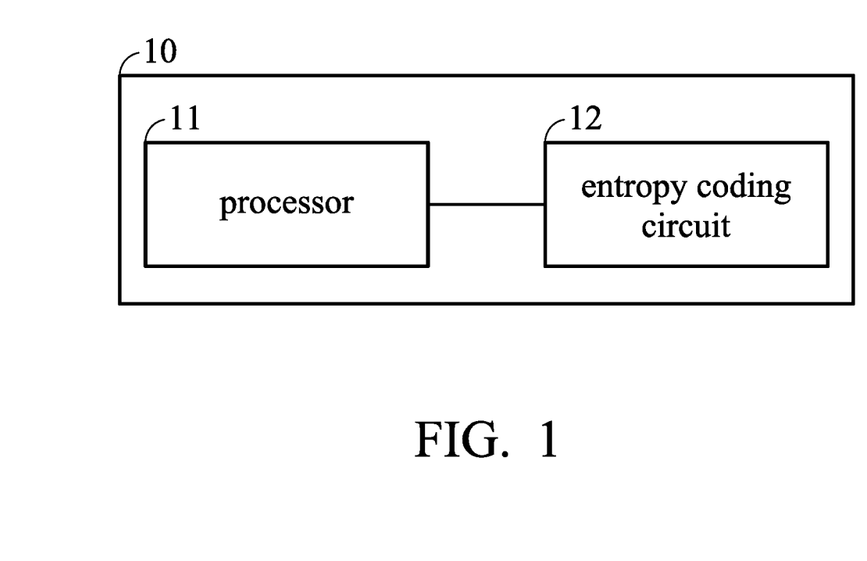
FIG. 1 shows one exemplary embodiment of a lossless data compression device.

FIG. 1 is a schematic diagram illustrating a lossless data compression device according to one exemplary embodiment of the invention. In the embodiment, the lossless data compression device 10 utilizes lossless data compression technology which is applied to remove or try to remove the repeated and redundant part in the raw data stream without losing any information therein. Specifically, the lossless data compression device 10 comprises a processor 11 and an entropy coding circuit 12.

The processor 11 is arranged to receive a compression command for the raw data stream, the processor 11 determines whether the raw data stream matches data items in a pre-built dictionary and outputs corresponding codewords according to the determination result.

The processor 11 provides processing capability for the lossless data compression device 10. That is, the operations, excluding the data compression operation, of the lossless data compression device 10 are performed by the processor 11, such as the communication operation and the calculation operation. Thus, the processing resource for the processor 11 is limited, and the processor 11 has strong competitiveness. Additionally, the processor 11 serves as the control core of the lossless data compression device 10 and has enough storage space. During the data compression process of the embodiment, the dictionary requires a larger storage space, and the entropy coding takes more processing resource because the entropy coding involves an algorithm. Thus, for the data compression, the process of looking up the dictionary and the process of performing the entropy coding are performed by two different hardware portions, respectively. The processor 11 is arranged to look up the dictionary. In detail, when receiving the compression command for the raw data stream, the processor 11 determines whether the raw data stream matches data items in the pre-built dictionary and outputs corresponding codewords according to the determination result. Specifically, the processor 11 determines whether the raw data stream matches data items in the pre-built dictionary and outputs corresponding codewords according to the determination result by using encoding algorithm, such as LZ77, LZSS, LZ78, LZW etc.

The dictionary may be a static dictionary or a dynamic dictionary. The static dictionary is built before the raw data stream is compressed, and the content of the dictionary is not changed during the compression process. That is, the dictionary is not related to the raw data stream. The capacity of the dictionary is usually larger for recording various data items and the corresponding codewords. The codewords represent the corresponding data items, and the length of the codewords is shorter than that of the corresponding data items. The dynamic dictionary is built during the raw data stream is compressed, and the content of the dictionary is changed according to the data of the raw data stream during the compression process. For example, at the beginning of the compression process, the content of the dictionary is empty. Each time it is determined whether partial data in the raw data stream matches one data item in the dictionary, the partial data is written into the dictionary. Usually, the dynamic dictionary includes data items and related information, such as the information of the address where the data items are in the raw data stream.

In the embodiment, when the processor 11 determines that the data in the raw data stream matches the data items in the dictionary, the processor 11 outputs the codewords corresponding to the matching data items in the dictionary to represent the data on the raw data stream. When the processor 11 determines that the data of the raw data stream does not match the data items in the dictionary, the processor 11 directly outputs the data in the raw data stream. It should be understood that the final data compression ratio of the raw data stream is related to the capacity of the dictionary used for the matching operation. As the number of data items included in the dictionary is larger, the possibility of the data in the raw data stream matching the data items is greater. Accordingly, among the raw data stream, the quantity of data which can be represented by using the codewords of the dictionary is greater. The final data compression ratio is greater.

The entropy coding circuit 12 is arranged to perform entropy coding on the output codewords to obtain compressed data stream.

The entropy coding is a coding operation which is performed based on the entropy principle without losing any information during the coding. The information entropy is an average of the information contained in the information source (uncertain measurement). As described above, the entropy coding takes more processing resource. Thus, the lossless data compression device 10 specially arranges an independent entropy coding circuit to perform the entropy coding on the codewords output from the processor 11, which prevents the resource required by the entropy coding process from contending with the resource required by other operations of the lossless data compression device 10. Thus, the data compression rate is enhanced. The algorithm which is used by the entropy coding is a coding algorithm, such as Shannon coding, Huffman coding, arithmetic coding (such as adaptive binary arithmetic coding), and so on.

According to the embodiment, the processor determines whether the data in the raw data stream matches the items in the dictionary and outputs the corresponding codewords according to the determination result. Since the processor has larger memory space, it is ensured that there is enough storage space for the dictionary, and it is further ensured that the data compression ratio is greater. Moreover, the lossless data compression device arranges the entropy coding circuit special for the entropy coding, which prevents the resource contention during the entropy coding, thereby increasing the data compression rate.

Figure 2:
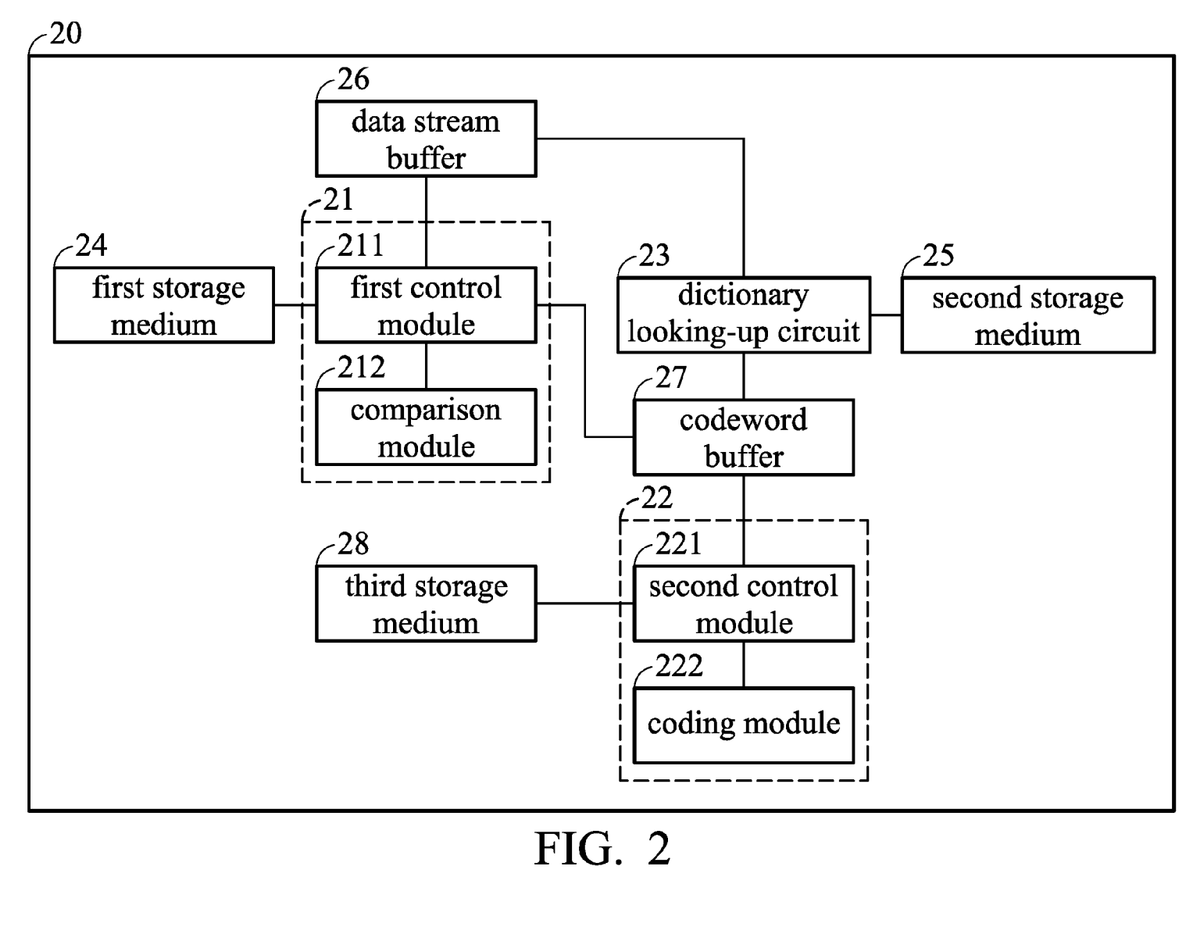
FIG. 2 shows another exemplary embodiment of a lossless data compression device.

FIG. 2 is a schematic diagram illustrating a lossless data compression device according to another exemplary embodiment of the invention. The difference between the embodiments of FIGS. 1 and 2 is that the lossless data compression device 20 further comprises a dictionary looking-up circuit 23, a first storage medium 24 coupled with a processor 21, and a second storage medium 25 coupled with the dictionary looking-up circuit 23. The first storage medium 24 is arranged to provide storage space for the processor 21. The first storage medium 24 can be used to store the dictionary described above. Usually, in order to satisfy the storage requirement of the processor 21, the first storage medium 24 has more storage space. For example, the first storage medium 24 is a dynamic random access memory (DRAM). The second storage medium 25 is arranged to provide storage space for the dictionary looking-up circuit 23. The second storage medium 25 can also be used to store the dictionary. For example, the second storage medium 25 is a static random access memory (SRAM).

When a compression command for the raw data stream is received and the data quantity of the raw data stream exceeds a predetermined data quantity, the processor 21 is arranged to determine whether the raw data stream matches the data items in the dictionary in the first storage medium 24 and outputs corresponding codewords according to the determination result to the entropy coding circuit 22. The predetermined data quantity is defined by users or defined by the processor 21 according to the current idle resource of the processor 21. Usually, the predetermined data quantity is not less than 1 MB. For example, the predetermined data quantity is equal to 1 MB or 2 MB.

When the compression command for the raw data stream is received and the data quantity of the raw data stream does not exceed the predetermined data quantity, the dictionary looking-up circuit 23 is arranged to determine whether the raw data stream matches the data items in the dictionary in the second storage medium 25 and outputs corresponding codewords according to the determination result to the entropy coding circuit 22. For example, the processor 21 receives a compression command for the raw data stream and determines whether the data quantity of the raw data stream exceeds the predetermined data quantity. When the processor 21 determines that the data quantity of the raw data stream exceeds the predetermined data quantity, the processor 21 performs the dictionary looking-up operation by itself; when the processor 21 determines that the data quantity of the raw data stream does not exceed the predetermined data quantity, the processor 21 forwards the compression command to the dictionary looking-up circuit 23, and the dictionary looking-up circuit 23 performs the dictionary looking-up operation.

In the embodiment, the data quantity of the raw data stream exceeding the predetermined data quantity indicates that the capacity of the dictionary required for the raw data stream is greater. In order to ensure that enough storage space is provided for the dictionary, the dictionary looking-up operation is performed by the processor 21. The data quantity of the raw data stream not exceeding the predetermined data quantity indicates that the capacity of the dictionary required for the raw data stream is less. Thus, it is not necessary to provide more storage space for the dictionary. At this time, the dictionary looking-up operation is performed by the dictionary looking-up circuit 23 which is arranged specially, which prevents the resource contention during the dictionary looking-up operation, thereby increasing data compression rate.

Specifically, the lossless data compression device 20 further comprises a data stream buffer 26, a codeword buffer 27, and a third storage medium 28. The data stream buffer 26 is arranged to store the raw data stream. The processor 21 comprises a first control module 211 and a comparison module 212. The entropy coding circuit 22 comprises a second control module 221 and a coding module 222.

When the compression command is received, the first control module 211 is arranged to retrieve data of the raw data stream from the data stream buffer 26, find out at least one data item which matches a front part of the retrieved data by looking up the pre-built dictionary, and write the retrieved data into the dictionary. The data items in the dictionary are other data in the raw data stream which was written into the dictionary previously. That is, the data items were written into the dictionary during which the first control module 211 retrieved other data in the raw data stream for determining whether the other data matches the data items in the dictionary. The content of the at least one data item that matches the front part of the retrieved data are at least the same as the beginning part of the retrieved data. For example, the retrieved data is "abc", and the found-out data item is "ab".

In the embodiment, the dictionary is a Hash table.

When the first control module 211 finds out the data item, the comparison module 212 is arranged to compare the retrieved data with the fount-out data item to obtain the data length of the matching part between the retrieved data and the found-out data item.

While the first control module 211 finds the data item, the first control module 211 is further arranged to output the unmatching part between the retrieved data and the data item, the address of the found-out data item in the raw data stream, and the data length of the matching part to the codeword buffer 27 to serve as the corresponding codeword. In the case where no data item is found out, the first control module 211 outputs the retrieved data to the codeword buffer 27 to serve as the corresponding codeword.

The address of the found-out data item in the raw data stream can be regarded as the relative address of the data item to the starting character in the raw data stream or the relative address of the data item to the retrieved data in the raw data stream. For example, the retrieved data is "abc" and the starting character is the tenth character in the raw data stream, and the found-out data item is "ab" and the starting character is the third character in the raw data stream. The address of the data item in the raw data stream is represented by the number of characters between the data item and the retrieved data, which is equal to 7. The data length of the matching part is two characters, and the unmatching part is "c". Accordingly, the corresponding codeword output by the first control module 211 is (7, 2)c.

The third storage medium 28 is arranged to store a probability table. The probability table is used to record the occurrence probabilities of the corresponding codewords of the raw data stream.

The second control module 221 is arranged to retrieve the codewords in the codeword buffer 27, calculate the occurrence probability of the retrieved codeword among all of the corresponding codewords of the raw data stream, and record the occurrence probability of the retrieved codeword in the probability table. Accordingly, the second control module 221 calculates the occurrence probabilities of all the codewords stored in the codeword buffer 27 and records the occurrence probabilities in the probability table.

The coding module 222 is arranged to perform entropy coding on the corresponding codewords of the raw data stream and the occurrence probabilities of the corresponding codewords to obtain compressed data stream accordingly.

To easily understand, an example is provided in the following description.

The raw data stream to be compressed is "abcdabceabcef", and the raw data stream is stored in the data stream buffer 26. When the processor 21 receives a compression command, the processor 21 calculates the quantity data of raw data stream is equal to 2 MB, which is greater than the predetermined data quantity of 1 MB. Thus, the dictionary looking-up operation will be performed by the processor 21 itself. A specific embodiment is:

1) the processor 21 performing the dictionary looking-up operation:

During the compression process, an empty dictionary is built first. The first control module 211 retrieves "a" from the data stream buffer 26, and the first control module 211 does not find out any data item from the empty dictionary. The first control module 211 writes "a" in the dictionary and output (0, 0)a to the codeword buffer 27. According to the similar manner, the first control module 211 retrieves "b", "c", and from the data stream buffer 26, writes them in the dictionary, and outputs (0,0)b, (0,0)c, and (0,0)d.

The first control module 211 then retrieves the fifth character "a" and finds out the matching "a" from the dictionary "abcd". The first control module 211 proceeds to retrieve the following characters "bc" until the unmatching character "e" appears, so that the longest data which matches the data item in the dictionary is obtained. In detail, the data retrieved by the first control module 211 is "abce", and the matching data item found from the dictionary "abcd" is "abc". The retrieved data "abce" is written into the dictionary for the matching operation related to the data which is retrieved later. The comparison module 212 compares the retrieved data "abce" and the data item "abc" to obtain that the data length of the matching part is 3. The first control module 211 obtains the relative address (5−1=4) between the retrieved data "abce" starting from the fifth character in the raw data stream and "abc" starting from the first character in the raw data stream to serve as the address of the found-out data item and outputs the codeword (4,3)e to the codeword buffer 27.

According to the above description, the corresponding codewords for the raw data stream are shown in Table 1.

TABLE 1

| The retrieved data | The address of the retrieved data in the raw data stream | The found-out data item ("—" represents none) | The output corresponding codeword |
|---|---|---|---|
| a | 1 | — | (0, 0)a |
| b | 2 | — | (0, 0)b |
| c | 3 | — | (0, 0)c |
| d | 4 | — | (0, 0)d |
| abce | 5 | abc | (4, 3)e |
| abce | 9 | abc | (4, 3)e |
| f | 13 | — | (0, 0)f |

2) the entropy coding circuit 22 performing the entropy coding:

During the process of the second control module 221 calculating the occurrence probabilities of the corresponding codewords of the raw data stream, the second control module 221 builds an empty probability table. Then, the second control module 221 sequentially retrieves the codewords from the codeword buffer 27. Each the second control module 221 retrieves one codeword, the second control module 221 updates the number of times, recorded in the probability table, when the one codeword occurs among all of the corresponding retrieved codewords of the raw data stream. After all of the codewords in the codeword buffer 27 have been retrieved, the second control module 221 calculates the occurrence probability of each codeword in the probability table. As shown in Table 1, the occurrence probability of each of the codewords (0,0)a, (0,0)b, (0,0)c, (0,0)d, and (0,0)f is 1/7, while the occurrence probability of the codeword (4,3)e is 2/7. The coding module 222 obtains the corresponding codewords of the raw data stream output from the second control module 221 and further obtains the occurrence probability of each of the corresponding codeword. The coding module 222 performs entropy coding on the corresponding codewords and their occurrence probabilities to obtain compressed data stream corresponding to the raw data stream.

It should be understood that, in other embodiments, the dictionary looking-up circuit can perform the dictionary looking-up operation by utilizing the operations of the processor. In other words, the dictionary looking-up circuit may comprise the first control module and the comparison module to perform the dictionary looking-up operation.

Figure 3:
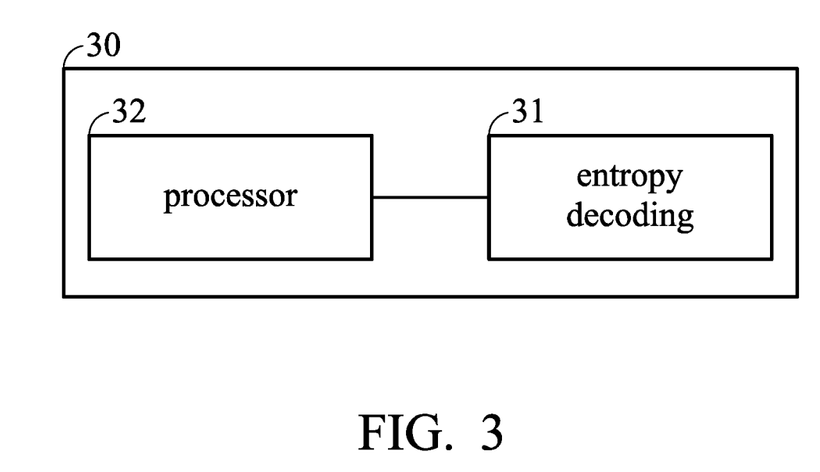
FIG. 3 shows one exemplary embodiment of a lossless data decompression device.

FIG. 3 is a schematic diagram illustrating a lossless data decompression device according to an exemplary embodiment of the invention. Referring to FIG. 3, a lossless data decompression device 30 is a decompression device corresponding to the lossless data compression device described above and comprises an entropy decoding circuit 31 and a processor 32.

Similar to the processor 11 in the above embodiment, the processor 32 provides processing capability for the lossless data decompression device 30. Thus, the processing resource for the processor 32 is limited, and the processor 32 has strong competitiveness. Additionally, the processor 32 has enough storage space. During the data decompression process of the embodiment, a dictionary requires larger storage space, and, similar to the entropy coding, the entropy decoding takes more processing resource because the entropy decoding involves algorithm. Thus, in the embodiment, the process of performing the entropy decoding and the process of looking up the dictionary are performed by two different hardware portions, the entropy decoding circuit 31 and the processor 32, respectively.

When a decompression command for the compressed data stream is received, the entropy decoding circuit 31 performs entropy decoding on the compressed data stream to obtain corresponding codewords.

The entropy decoding is the inverse operation corresponding to the recited entropy coding. As described above, the entropy decoding takes more processing resource. Thus, the lossless data decompression device 30 specially arranges an independent entropy decoding circuit to perform the entropy decoding on the compressed data stream, which prevents the resource required by the entropy decoding process from contending with the resource required by other operations of the lossless data decompression device 30. Thus, the data decompression rate is enhanced. The algorithm which is used by the entropy decoding is a decoding algorithm, such as Shannon coding, Huffman coding, arithmetic coding (such as adaptive binary arithmetic coding), and so on.

The processor 32 is arranged to look up the pre-built dictionary to obtain raw data corresponding to the codewords output from the entropy decoding circuit and outputs a raw data stream which is composed of the obtained raw data.

The processor 32 performs the dictionary looking-up operation by using decoding algorithm, such as LZ77, LZSS, LZ78, LZW. The dictionary looking-up operation is performed by looking up the pre-built dictionary to find out data items which match the codewords output from the entropy decoding circuit and obtaining the corresponding raw data according to the codewords and the data items.

The dictionary can be a static dictionary or a dynamic dictionary. The static dictionary is built before the compressed data stream is decompressed, and the content of the dictionary is not changed during the decompression process. That is, the dictionary is not related to the current compressed data stream. The capacity of the dictionary is usually larger for recording various data items and the corresponding codewords. The dynamic dictionary is built during the compressed data stream is decompressed, and the content of the dictionary is changed according to the data of the compressed data stream during the decompression process. For example, at the beginning of the decompression process, the content of the dictionary is empty. Each time, according to the dictionary and one codeword obtained by perform the entropy decoding on the compressed data stream, the raw data corresponding to the codeword is obtained, the raw data serves as one data item to be written into the dictionary. Usually, the dynamic dictionary includes data items and related information, such as the information of the address where the data items is in the raw data stream.

In the embodiment, the processor looks up the dictionary to find out the raw data corresponding to the codewords output from the entropy decoding circuit. Since the processor has larger memory space, it is ensured that there is enough storage space for the dictionary, and it is further ensured that the decoding can be performed completely to obtain the raw data corresponding to the compressed data stream. Moreover, the lossless data compression device arranges the entropy decoding circuit specially for the entropy decoding, which prevents the resource contention during the entropy decoding, thereby increasing data decompression rate.

Figure 4:
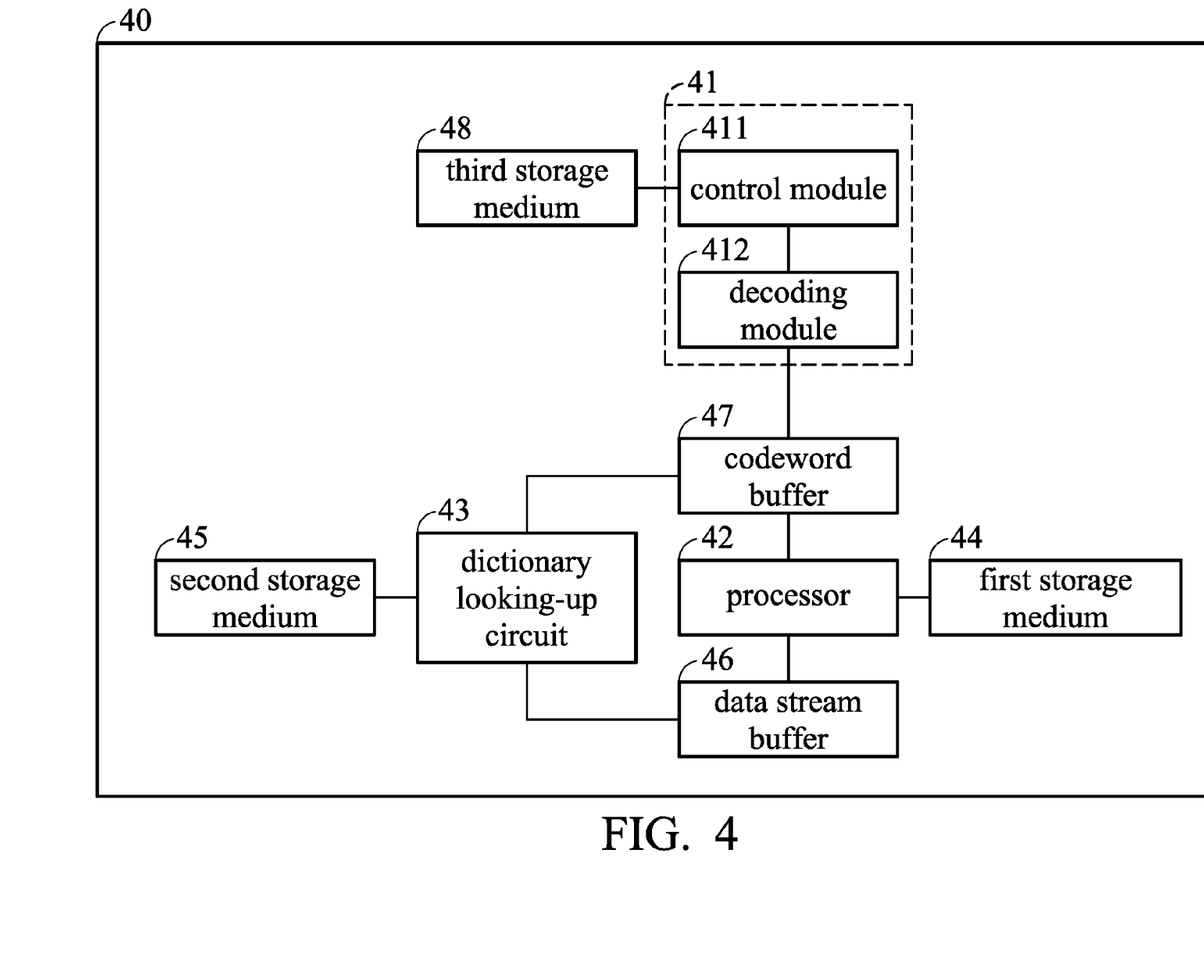
FIG. 4 shows another exemplary embodiment of a lossless data decompression device.

FIG. 4 is a schematic diagram illustrating a lossless data decompression device according to another exemplary embodiment of the invention. The difference between the embodiments of FIGS. 3 and 4 is that the lossless data decompression device 40 further comprises a dictionary looking-up circuit 43, a first storage medium 44 coupled with a processor 42, and a second storage medium 45 coupled with the dictionary looking-up circuit 43. The first storage medium 44 is arranged to provide storage space for the processor 42. The first storage medium 44 can be used to store the dictionary described above. Usually, in order to satisfy the storage requirement of the processor 42, the first storage medium 44 has more storage space. For example, the first storage medium 44 is a dynamic random access memory (DRAM). The second storage medium 45 is arranged to provide storage space for the dictionary looking-up circuit 43. The second storage medium 45 can be also used to store the dictionary. For example, the second storage medium 45 is a static random access memory (SRAM).

When the data quantity of the compressed data stream exceeds a predetermined data quantity, the processor 42 is arranged to look up the pre-built dictionary to find out the raw data corresponding to the codewords output from the entropy decoding circuit 41 and output the raw data stream composed of the raw data. The predetermined data quantity is defined by users or defined by the processor 42 according to the current idle resource of the processor 42. Usually, the predetermined data quantity is not less than 1 MB. For example, the predetermined data quantity is equal to 1 MB or 2 MB.

When the data quantity of the compressed data stream does not exceed the predetermined data quantity, the dictionary looking-up circuit 43 is arranged to look up the pre-built dictionary to find out the raw data corresponding to the codewords output from the entropy decoding circuit 41 and output the raw data stream composed of the raw data. For example, when the processor 42 receives a decompression command for the compressed data stream and determines whether the data quantity of the compressed data stream exceeds the predetermined data quantity. When the processor 42 determines that the data quantity of the compressed data stream exceeds the predetermined data quantity, the processor 42 performs the dictionary looking-up operation by itself; when the processor 42 determines that the data quantity of the raw data stream does not exceed the predetermined data quantity, the processor 42 forwards the compression command to the dictionary looking-up circuit 43, and the dictionary looking-up circuit 43 performs the dictionary looking-up operation.

In the embodiment, the data quantity of the compressed data stream exceeding the predetermined data quantity indicates that the capacity of the dictionary required for the compressed data stream is greater. In order to ensure that enough storage space is provided for the dictionary, the dictionary looking-up operation is performed by the processor 42. The data quantity of the compressed data stream not exceeding the predetermined data quantity indicates that the capacity of the dictionary required for the compressed data stream is less. Thus, it is not necessary to provide more storage space for the dictionary. At this time, the dictionary looking-up operation is performed by the dictionary looking-up circuit 43 which is arranged specially, which prevents the resource contention during the dictionary looking-up operation, thereby increasing data decompression rate.

Specifically, the lossless data decompression device 40 further comprises a data stream buffer 46, a codeword buffer 47, and a third storage medium 48. The entropy decoding circuit 41 comprises a control module 411 and a decoding module 412. The third storage medium 48 is arranged to store a probability table. The probability table is built during the compression process of the compressed data stream. That is, the probability table stored in the third storage medium 48 is the probability table recited in the above embodiment of the lossless data compression device.

The control module 411 is arranged to find out the occurrence probabilities of the codewords corresponding to the compressed data stream by using the above probability table.

The decoding module 412 is arranged to perform the entropy decoding on the compressed data stream according to the occurrence probabilities of the codewords corresponding to the compressed data stream to obtain the corresponding codewords.

The codeword buffer 47 is arranged to store the codewords from the entropy decoding circuit 41. One codeword comprises the addresses of the data item in the dictionary which matches the codeword, the data length of the data item, and the unmatching part between the raw data corresponding to the codeword and the data item.

The processor 42 is arranged to retrieve the data item which is indicated by the address and has the data length from the dictionary. The processor 42 is further arranged to combine the data item and the unmatching part to obtain the raw data corresponding to the codeword. Then, the processor 42 is arranged to store the raw data into the raw data stream buffer 46.

In the embodiment, the dictionary is a Hash table.

The addresses of the data item in the dictionary which matches the codeword, can be regarded as the relative address of the data item to the starting character in the raw data stream or the relative address of the data item to the raw data corresponding to the codeword in the raw data stream.

To easily understand, an example will be illustrated by taking the compressed data stream obtained from the lossless data compression device above.

1) the entropy decoding circuit 41 performing the entropy decoding:

The control module 411 finds out the occurrence probabilities of the codewords corresponding to the compressed data stream by referring to the probability table built during the data compression process. The occurrence probabilities of the codewords are 1/7, 1/7, 1/7, 1/7, 2/7, and 1/7, respectively. The decoding module 412 obtains the occurrence probability of each codeword from the control module 411 and performs the entropy decoding on the compressed data stream to obtain the codewords, which are (0,0)a, (0,0)b, (0,0)c, (0,0)d, (4,3)e, (4,3)e, and (0,0)f respectively. The decoding module 412 outputs the obtained codewords to the codeword buffer 47.

2) the processor 42 performing the dictionary looking-up operation:

The processor 42 determines that the data quantity of the compressed data stream is 1.1 MB which exceeds the predetermined data quantity of 1 MB, the processor 42 then determines that the dictionary looking-up operation will be performed by itself. Specifically, the processor 42 builds an empty dictionary in the first storage medium first and retrieves the first codeword (0,0)a from the codeword buffer 47. Based on the predetermined codeword definition, the processor 42 determines the matching data item in the dictionary for the raw data corresponding to the codeword and further determines that the unmatching part is "a". Thus, the processor 42 outputs "a" to serve as the raw data corresponding to the codeword and writes "a" into the dictionary. Similarly, the processor 42 outputs the corresponding raw data "b", "c", and "d" according to the codewords (0,0)b, (0,0)c, and (0,0)d, respectively, and writes "b", "c", and "d" into the dictionary. At this time, the dictionary stores "abcd".

The processor 42 proceeds to retrieve the codeword (4,3)e from the codeword buffer 47. According the information of the retrieved codeword, the processor 42 obtains that the item data matching the codeword comprises three characters starting from the least fourth character (that is "abc") and that the unmatching part is "e". Thus, the raw data corresponding to the codeword is "abce", and "abce" is written into the dictionary. Similarly, the processor 42 obtains raw data "abce" and "f" according to the codewords (4,3)e and (0,0)f, respectively, and writes "abce" and "f" into the dictionary. Now, the processor 42 has recovered the raw data according to all the codewords, and the raw data is composed of "abcdabceabcef".

It should be understood that, in other embodiments, the dictionary looking-up circuit can perform the dictionary looking-up operation by utilizing the operations of the processor.

In an embodiment, the lossless data compression device and the lossless decompression device can be integrated into the same device. That is, one device comprises the processor and the entropy coding circuit of the lossless data compression device and further comprises the processor and the entropy decoding circuit of the lossless decompression device, such that the device can accomplish the compression and decompression process. In this case, the processor of the lossless data compression device and the processor of the lossless decompression device can be integrated into one single processor.

Specifically, the lossless data compression device and the lossless decompression device can be any electronic terminals being capable of processing data, such as televisions, media boxes, mobile communication terminals (such as cell phones, tablet PCs), and so on.

The lossless data compression device and the lossless decompression device can perform compression and depression to data of the device. The applications of the embodiments will be described in the following. For example, for the running system of the device, such as Android, Windows, and IOS system, the lossless data compression device compresses the boot code of the running system according to the above compression process during the process for deactivating the running system. The compressed boot code is stored in a flash or ROM. When it is required to boot the running system of the device, the lossless data decompression device decompress the compressed boot code according to the above decompression process and loads the decompressed boot code into a DRAM for completing the booting of the running system. In another example, an install program of an application of the device is compressed according to the above compression process to obtain the install package, such as an install package APK for the Android system and an install package APP for IOS system. When it is required to install the install package, the device decompresses the compressed package to obtain the install program and executes the install program for achieving the installment. Thus, the device with the above compression and decompression operations is capable of performing the compression and decompression on data, which can save the storage space of the device. Moreover, the data quantity of the compressed data is less, which decreases the data quantity for reading/writing operations and further increases the data reading/writing rate.

Figure 5:
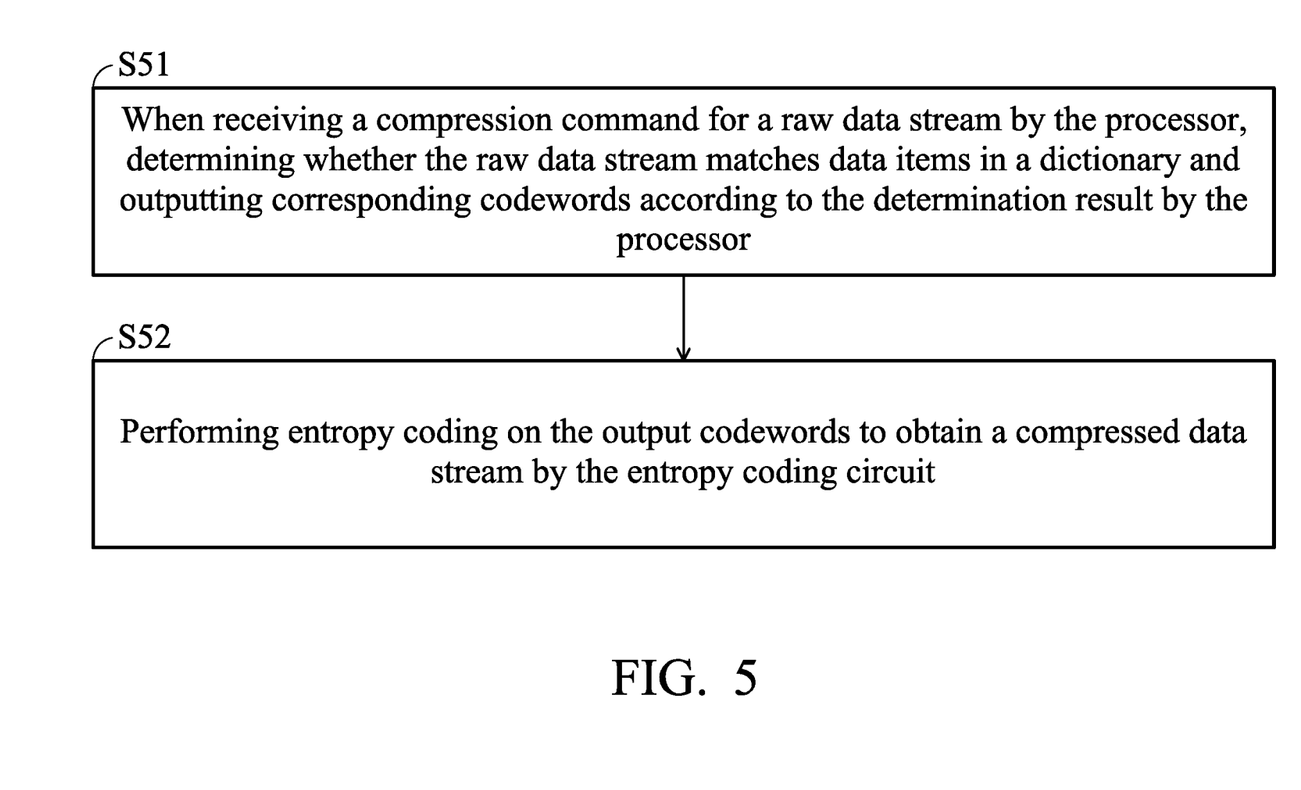
FIG. 5 shows an exemplary embodiment of a lossless data compression method.

FIG. 5 is a flow chart showing an exemplary embodiment of a lossless data compression method. The lossless data compression method may be performed by the lossless data compression device in the above embodiment which comprises a processor and an entropy coding circuit. The lossless data compression method comprises the following steps:

S51: when the processor receives a compression command for a raw data stream, the processor determines whether the raw data stream matches data items in a pre-built dictionary and outputs corresponding codewords according to the determination result.

S52: the entropy coding circuit performs entropy coding on the output codewords to obtain a compressed data stream.

Optionally, the lossless data compression device further comprises a first storage medium coupled with the processor, a dictionary looking-up circuit, and a second storage medium coupled with the dictionary looking-up circuit. Both of the first and second storage mediums are arranged to store the dictionary.

The step S51 comprises the following steps:

when the compression command for the raw data stream is received and the data quantity of the raw data stream exceeds a predetermined data quantity, the processor determining whether the raw data stream to be compressed matches the data items in the dictionary stored in the first storage medium and outputting the corresponding codewords according to the determination result; when the compression command for the raw data stream is received and the data quantity of the raw data stream does not exceed the predetermined data quantity, the dictionary looking-up circuit determining whether the raw data stream to be compressed matches the data items in the dictionary stored in the second storage medium and outputting the corresponding codewords according to the determination result to the entropy coding circuit.

Optionally, the lossless data compression device further comprises a data stream buffer and a codeword buffer. The data stream buffer is arranged to store the raw data stream.

In the step S51, the step of determining whether the raw data stream to be compressed matches the data items in the dictionary in the first storage medium and outputting the corresponding codewords according to the determination result comprises the following steps:

retrieving the data of the raw data stream from the data stream buffer, looking up the dictionary to find out at least one data item which matches a front part of the retrieved data, and writing the retrieved data into the dictionary, wherein the data items in the dictionary are other data in the raw data stream which was previously written into the dictionary;

when the data item is found out, comparing the retrieved data with the found-out data item to obtain the data length of the matching part between the retrieved data and the found-out data item and outputting the unmatching part between the retrieved data and the found-out data item, the address of the found-out data item in the raw data stream, and the data length of the matching part to the codeword buffer to serve as the corresponding codeword; when no data item is found out, outputting the retrieved data to the codeword buffer to serve as the corresponding codeword.

Optionally, the lossless data compression device further comprises a third storage medium which is arranged to store a probability table.

The step S52 comprises the following steps:

the entropy coding circuit retrieving each codeword in the codeword buffer, calculating the occurrence probability of the retrieved codeword among all of the corresponding codewords of the raw data stream, and recording the occurrence probability of the retrieved codeword in the probability table;

the entropy coding circuit performing entropy coding on the corresponding codewords of the raw data stream and the occurrence probabilities of the corresponding codewords to obtain the compressed data stream.

Optionally, the dictionary is a Hash table, and the entropy coding is the adaptive binary arithmetic coding.

In another embodiment, the lossless data compression method may comprise any operation which is performed by each portion in the lossless data compression device of the above embodiment.

Figure 6:
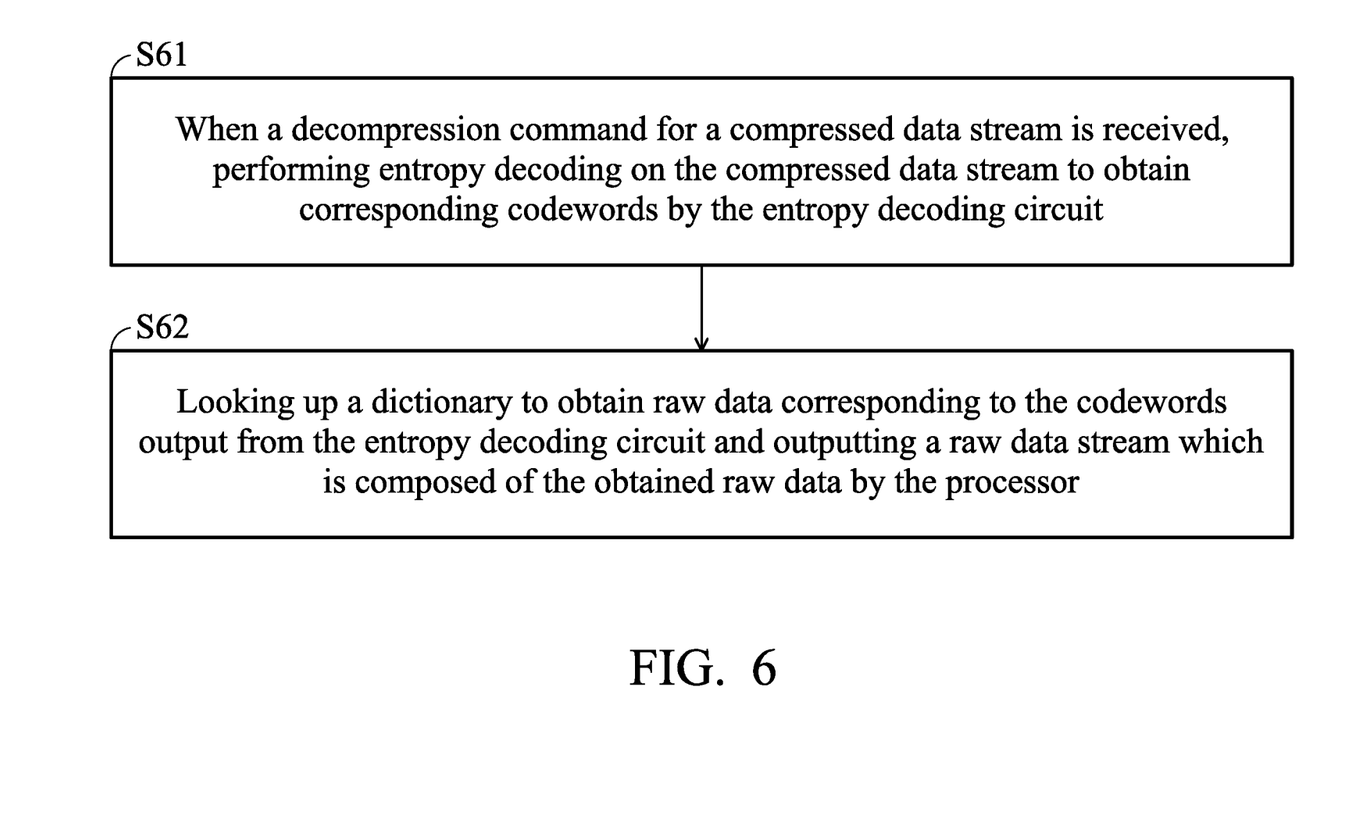
FIG. 6 shows an exemplary embodiment of a lossless data decompression method.

FIG. 6 is a flow chart showing an exemplary embodiment of a lossless data decompression method. The lossless data decompression method may be performed by the lossless data decompression device in the above embodiment which comprises an entropy decoding circuit and a processor. The lossless data decompression method comprises the following steps:

S61: when a decompression command for a compressed data stream is received, the entropy decoding circuit performs entropy decoding on the compressed data stream to obtain corresponding codewords;

S62: the processor looks up a pre-built dictionary to obtain raw data corresponding to the codewords output from the entropy decoding circuit and outputs a raw data stream which is composed of the obtained raw data.

Optionally, the lossless data decompression device further comprises a first storage medium coupled with the processor, a dictionary looking-up circuit, and a second storage medium coupled with the dictionary looking-up circuit. Both of the first and second storage mediums are arranged to store the dictionary.

The step S61 comprises the following steps:

when the data quantity of the compressed data stream exceeds a predetermined data quantity, the processor looking up a pre-built dictionary to find out the raw data corresponding to the codewords output from the entropy decoding circuit and outputting the raw data stream composed of the raw data; when the data quantity of the compressed data stream does not exceed the predetermined data quantity, the dictionary looking-up circuit looking up the pre-built dictionary to find out the raw data corresponding to the codewords output from the entropy decoding circuit and outputting the raw data stream composed of the raw data.

Optionally, the lossless data decompression device further comprises a data stream buffer and a codeword buffer. The codeword buffer is arranged to store the codewords output from the entropy decoding circuit. Each codeword comprises the address of the data item in the dictionary matching the codeword, the data length of the data item, and the unmatching part between the raw data corresponding to the codeword and the data item.

The step S61 of looking up a pre-built dictionary to find out the raw data corresponding to the codewords output from the entropy decoding circuit and outputting the raw data stream composed of the raw data comprises the following steps: retrieving the data item which is indicated by the address and has the data length from the dictionary, combining the data item and the unmatching part to obtain the raw data corresponding to the codeword, and storing the raw data into the data stream buffer.

Optionally, the lossless data decompression device further comprises a third storage medium which is arranged to store a probability table.

The step S62 comprises the following steps:

the entropy decoding circuit referring to the probability table to find out the occurrence probabilities of the corresponding codewords corresponding to the compressed data stream;

the entropy decoding circuit performing the entropy decoding on the compressed data stream according to the occurrence probabilities of the corresponding codewords of the compressed data stream to obtain the corresponding codewords.

Optionally, the dictionary is a Hash table, and the entropy decoding is the adaptive binary arithmetic decoding.

In another embodiment, the lossless data decompression method may comprise any operation which is performed by each portion in the lossless data decompression device of the above embodiment.

In the above embodiment, the processor performs the operations related to the pre-built dictionary. Since the processor has larger storage space, it is ensured that there is enough storage space for the dictionary, and it is further ensured that the data compression ratio is greater. Moreover, the lossless data compression device or lossless data decompression device arranges the entropy coding circuit or entropy decoding circuit, which prevents the resource contention during the entropy coding or the entropy decoding, thereby increasing data compression rate.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lossless data compression device comprising:
  a processor arranged to determine whether a raw data stream matches data items in a dictionary when a compression command for the raw data stream is received and output corresponding codewords according to the determination result;
an entropy coding circuit arranged to perform entropy coding on the corresponding codewords to obtain a compressed data stream;
a first storage medium coupled with the processor;
a dictionary looking-up circuit; and
a second storage medium coupled with the dictionary looking-up circuit, wherein both of the first and second storage mediums are arranged to store the dictionary.

2. The lossless data compression device as claimed in claim 1, wherein when the compression command for the raw data stream is received and a data quantity of the raw data stream exceeds a predetermined data quantity, the processor determines whether the raw data stream to be compressed matches the data items in the dictionary stored in the first storage medium and outputs the corresponding codewords according to the determination result to the entropy coding circuit.

3. The lossless data compression device as claimed in claim 1, wherein when the compression command for the raw data stream is received and the data quantity of the raw data stream does not exceed a predetermined data quantity, the dictionary looking-up circuit determines whether the raw data stream to be compressed matches the data items in the dictionary stored in the second storage medium and outputs the corresponding codewords according to the determination result to the entropy coding circuit.

4. The lossless data compression device as claimed in claim 1 further comprising a data stream buffer and a codeword buffer, wherein the data stream buffer is arranged to store the raw data stream.

5. The lossless data compression device as claimed in claim 4, wherein the processor comprises:
a first control module arranged to retrieve data of the raw data stream from the data stream buffer when the compression command is received, look up the dictionary to find out at least one data item which matches a front part of the retrieved data, and write the retrieved data into the dictionary, wherein the data items in the dictionary are other data in the raw data stream which was written into the dictionary previously; and
a comparison module arranged to, when the first control module has found out the at least one data item, compare the retrieved data and the at least one data item to obtain a data length of a matching part between the retrieved data and the at least one data item.

6. The lossless data compression device as claimed in claim 5,
wherein when the at least one data item is found out, the first control module is arranged to output an unmatching part between the retrieved data and the at least one data item, an address of the at least one data item in the raw data stream, and the data length to the codeword buffer to serve as the corresponding codewords, and
wherein when no data item is found out, the control module outputs the retrieved data to the codeword buffer to serve as the corresponding codewords.

7. The lossless data compression device as claimed in claim 4 further comprising a third storage medium, and the third storage medium is arranged to store a probability table, wherein the entropy coding circuit comprises:
a second control module arranged to retrieve each codeword in the codeword buffer, calculate an occurrence probability of the retrieved codeword among all of the corresponding codewords of the raw data stream, and record the occurrence probability of the retrieved codeword in the probability table; and
a coding module arranged to perform the entropy coding on the corresponding codewords of the raw data stream and the occurrence probabilities of the corresponding codewords to obtain the compressed data stream.

8. The lossless data compression device as claimed in claim 1, wherein the dictionary is a Hash table, and the entropy coding is an adaptive binary arithmetic coding.

9. A lossless data decompression device comprising:
an entropy decoding circuit arranged to, when a decompression command for a compressed data stream is received, perform entropy decoding on the compressed data stream to obtain corresponding codewords;
a processor arranged to look up a dictionary to obtain raw data corresponding to the corresponding codewords output from the entropy decoding circuit and output a raw data stream which is composed of the raw data;
a first storage medium coupled with the processor;
a dictionary looking-up circuit; and
a second storage medium coupled with the dictionary looking-up circuit, wherein both of the first and second storage mediums are arranged to store the dictionary.

10. The lossless data decompression device as claimed in claim 9, wherein when a data quantity of the compressed data stream exceeds a predetermined data quantity, the processor looks up the dictionary stored in the first storage medium to find out the raw data corresponding to the corresponding codewords output from the entropy decoding circuit and outputs the raw data stream composed of the raw data.

11. The lossless data decompression device as claimed in claim 9, wherein when a data quantity of the compressed data stream does not exceed a predetermined data quantity, the dictionary looking-up circuit looks up the dictionary stored in the second storage medium to find out the raw data corresponding to the corresponding codewords output from the entropy decoding circuit and outputs the raw data stream composed of the raw data.

12. The lossless data decompression device as claimed in claim 9 further comprising a data stream buffer and a codeword buffer,
wherein the codeword buffer is arranged to store the corresponding codewords output from the entropy decoding circuit, and each corresponding codeword comprises an address of a data item in the dictionary matching the corresponding codeword, a data length of the data item, and an unmatching part between the raw data corresponding to the corresponding codeword and the data item; and
wherein the processor retrieves the data item, which is indicated by the address and has the data length, from the dictionary, combines the data item and the unmatching part to obtain the raw data corresponding to the corresponding codeword, and stores the raw data into the data stream buffer.

13. The lossless data decompression device as claimed in claim 9 further comprising a third storage medium, wherein the third storage medium is arranged to store a probability table which is built during a compression process,
wherein the entropy decoding circuit comprises:
a control module arranged to refer to the probability table to find out occurrence probabilities of the corresponding codewords corresponding to the compressed data stream; and
a decoding module arranged to perform the entropy decoding on the compressed data stream according to the occurrence probabilities of the corresponding codewords of the compressed data stream to obtain the corresponding codewords.

14. The lossless data decompression device as claimed in claim 9, wherein the dictionary is a Hash table, and the entropy decoding is an adaptive binary arithmetic decoding.

15. A lossless data compression method for a lossless data compression device, the lossless data compression device comprising a processor, an entropy coding circuit, a first storage medium couple with the processor, a dictionary looking-up circuit, and a second storage medium coupled with the dictionary looking-up circuit, wherein both of the first and second storage mediums are arranged to store a dictionary, the lossless data compression method comprising:

when a compression command for the raw data stream is received, determining whether a raw data stream matches data items in the dictionary and outputting corresponding codewords according to the determination result by the processor; and performing entropy coding on the corresponding codewords to obtain a compressed data stream by the entropy coding circuit.

16. The lossless data compression method as claimed in claim 15, wherein the step of when the compression command for the raw data stream is received, determining whether the raw data stream matches data items in the dictionary and outputting the corresponding codewords according to the determination result by the processor comprises:

when the compression command for the raw data stream is received and a data quantity of the raw data stream exceeds a predetermined data quantity, determining whether the raw data stream to be compressed matches the data items in the dictionary stored in the first storage medium and outputting the corresponding codewords according to the determination result by the processor; and when the compression command for the raw data stream is received and the data quantity of the raw data stream does not exceed the predetermined data quantity, determining whether the raw data stream to be compressed matches the data items in the dictionary stored in the second storage medium and outputs the corresponding codewords according to the determination result to the entropy coding circuit by the dictionary looking-up circuit.

17. A lossless data decompression method for a lossless data decompression device, the lossless data decompression device comprises an entropy decoding circuit a processor, a first storage medium coupled with the processor, a dictionary looking-up circuit, and a second storage medium coupled with the dictionary looking-up circuit, wherein both of the first and second storage mediums are arranged to store a dictionary, the lossless data decompression method comprising:

when a decompression command for a compressed data stream is received, performing entropy decoding on the compressed data stream to obtain corresponding codewords by the entropy decoding circuit; and looking up the dictionary to obtain raw data corresponding to the codewords output from the entropy decoding circuit and outputting a raw data stream which is composed of the raw data by the processor.

18. The lossless data decompression method as claimed in claim 17, wherein the step of looking up the dictionary to obtain the raw data corresponding to the codewords output from the entropy decoding circuit and outputting the raw data stream which is composed of the raw data by the processor comprises:

when a data quantity of the compressed data stream exceeds a predetermined data quantity, looking up the dictionary stored in the first storage medium to find out the raw data corresponding to the corresponding codewords output from the entropy decoding circuit and outputting the raw data stream composed of the raw data by the processor; and when the data quantity of the compressed data stream does not exceed the predetermined data quantity, looking up the dictionary stored in the second storage medium to find out the raw data corresponding to the corresponding codewords output from the entropy decoding circuit and outputting the raw data stream composed of the raw data by the dictionary looking-up circuit.

* * * * *